United States Patent
Wei et al.

(10) Patent No.: US 8,273,222 B2
(45) Date of Patent: Sep. 25, 2012

(54) APPARATUS AND METHOD FOR RF PLASMA ENHANCED MAGNETRON SPUTTER DEPOSITION

(75) Inventors: Ronghua Wei, San Antonio, TX (US); Sabrina L. Lee, Schenectady, NY (US)

(73) Assignee: Southwest Research Institute, San Antonio, TX (US)

( * ) Notice: Subject to any disclaimer, the term of this patent is extended or adjusted under 35 U.S.C. 154(b) by 1208 days.

(21) Appl. No.: 11/749,739

(22) Filed: May 16, 2007

(65) Prior Publication Data
US 2008/0169189 A1 Jul. 17, 2008

Related U.S. Application Data

(60) Provisional application No. 60/800,886, filed on May 16, 2006.

(51) Int. Cl.
C23C 14/00 (2006.01)
C23C 14/32 (2006.01)
C25B 9/00 (2006.01)
C25B 11/00 (2006.01)
C25B 13/00 (2006.01)

(52) U.S. Cl. .......... 204/192.3; 204/192.12; 204/192.32; 204/298.08; 204/298.21

(58) Field of Classification Search .............. 204/192.12, 204/298.28, 192.3, 192.32, 298.08, 298.21
See application file for complete search history.

(56) References Cited

U.S. PATENT DOCUMENTS

| | | | |
|---|---|---|---|
| 3,775,285 A | 11/1973 | Lane et al. | |
| 4,080,281 A | 3/1978 | Endo | |
| 4,126,530 A | 11/1978 | Thornton | |
| 4,179,351 A * | 12/1979 | Hawton et al. | 204/298.09 |
| 4,407,713 A | 10/1983 | Zega | |
| 4,410,407 A | 10/1983 | MaCaulay | |
| 4,445,997 A | 5/1984 | McKelvey | |
| 4,478,703 A * | 10/1984 | Edamura et al. | 204/298.28 |
| 4,520,268 A | 5/1985 | Xu | |
| 4,731,539 A | 3/1988 | Xu | |
| 4,812,217 A | 3/1989 | George et al. | |
| 4,960,753 A * | 10/1990 | Collins et al. | 204/298.06 |
| 5,268,085 A | 12/1993 | Nelson et al. | |
| 5,427,666 A | 6/1995 | Mueller et al. | |

(Continued)

FOREIGN PATENT DOCUMENTS

| | | |
|---|---|---|
| JP | 02251143 | 8/1990 |
| JP | 4107268 | 4/1992 |

OTHER PUBLICATIONS

International Search Report dated Nov. 5, 2007 issued in related International Patent Application No. PCT/EP2007/052374.

(Continued)

*Primary Examiner* — Jonathan Johnson
*Assistant Examiner* — Michael Band
(74) *Attorney, Agent, or Firm* — Grossman, Tucker et al.

(57) ABSTRACT

The present disclosure relates to an apparatus and method for depositing coatings on the surface of a workpiece with sputtering material in an ion plasma environment. The apparatus may include a magnetron including a core cooling system surrounded by a magnet assembly and target material having a surface capable of providing a source of sputtering material. An RF plasma generation assembly is also provided in the apparatus including an RF antenna capable of providing an RF plasma and drawing ions to one or both of the workpiece surface and target material surface.

6 Claims, 5 Drawing Sheets

U.S. PATENT DOCUMENTS

| | | | |
|---|---|---|---|
| 5,464,518 | A | 11/1995 | Sieck et al. |
| 5,516,403 | A | 5/1996 | Forster et al. |
| 5,527,438 | A | 6/1996 | Tepman |
| 5,557,927 | A | 9/1996 | Chiang et al. |
| 5,772,858 | A | 6/1998 | Tepman |
| 5,994,211 | A | 11/1999 | Wang et al. |
| 6,037,257 | A | 3/2000 | Chiang et al. |
| 6,042,700 | A * | 3/2000 | Gopalraja et al. ....... 204/192.15 |
| 6,132,805 | A | 10/2000 | Moslehi |
| 6,190,511 | B1 | 2/2001 | Wei |
| 6,190,516 | B1 | 2/2001 | Xiong et al. |
| 6,204,550 | B1 | 3/2001 | Wang et al. |
| 6,299,831 | B1 | 10/2001 | Lo |
| 6,315,877 | B1 | 11/2001 | Goedicke et al. |
| 6,358,376 | B1 | 3/2002 | Wang et al. |
| 6,413,383 | B1 | 7/2002 | Chiang et al. |
| 6,498,091 | B1 | 12/2002 | Chen et al. |
| 6,663,755 | B2 | 12/2003 | Gorokhovsky |
| 6,709,553 | B2 | 3/2004 | Wang et al. |
| 6,719,883 | B2 * | 4/2004 | Stimson ................... 204/192.12 |
| 6,730,196 | B2 | 5/2004 | Wang et al. |
| 6,740,393 | B1 | 5/2004 | Massler et al. |
| 6,758,949 | B2 | 7/2004 | Wang et al. |
| 6,767,436 | B2 | 7/2004 | Wei |
| 6,787,006 | B2 | 9/2004 | Gopalraja et al. |
| 6,863,699 | B1 | 3/2005 | Krasnov et al. |
| 7,320,331 | B1 | 1/2008 | Audino et al. |
| 7,578,908 | B2 * | 8/2009 | Hockley et al. .......... 204/192.12 |
| 2002/0185370 | A1 | 12/2002 | Gopalraja et al. |
| 2003/0111337 | A1 | 6/2003 | Lin et al. |
| 2003/0209422 | A1 | 11/2003 | Wang et al. |
| 2004/0016635 | A1 | 1/2004 | Ford et al. |
| 2004/0020770 | A1 | 2/2004 | Wang et al. |
| 2004/0031680 | A1 | 2/2004 | Miller et al. |
| 2004/0045811 | A1 | 3/2004 | Wang et al. |
| 2004/0055870 | A1 | 3/2004 | Wei |
| 2005/0279630 | A1 | 12/2005 | Fonte |
| 2006/0076231 | A1 | 4/2006 | Wei |
| 2006/0076235 | A1 | 4/2006 | Wei |
| 2006/0137968 | A1 | 6/2006 | Hartig |
| 2006/0177581 | A1 | 8/2006 | Chiang et al. |
| 2006/0183305 | A1 | 8/2006 | Gao et al. |
| 2006/0251872 | A1 | 11/2006 | Wang et al. |
| 2006/0251917 | A1 | 11/2006 | Chiang et al. |
| 2007/0059502 | A1 | 3/2007 | Wang et al. |
| 2008/0289957 | A1 | 11/2008 | Takigawa et al. |
| 2009/0114529 | A1 | 5/2009 | Dekempeneer et al. |
| 2010/0006421 | A1 | 1/2010 | Wei |

OTHER PUBLICATIONS

Xu et al., "Metal Ion Source for Metallic Surface Metallurgy," Proceedings: Tenth International Symposium on Discharges and Electric Insulation in Vacuum, pp. 368-373.

Li et al., "Diffusion Mechanism of Ion Bombardment," Surface Engineering 1987 vol. 4 No. 4 (3 pages).

Lee et al., "Electroplated and Plasma Enhanced Magnetron Sputtered Ta and Cr Coatings for High Temperature and High Pressure Operation," 2006 MRS Fall Meeting: Symposium DD—Materials Research at High Pressure, Jan. 1, 2006; Venue: Boston, Massachusetts, USA.

Xu et al., "Double glow plasma surface alloying and plasma nitriding," Surface and Coatings Technology vol. 201, Issues 9-11, Feb. 26, 2007, pp. 4822-4825.

Wei, et al., "Metal Plasma Immersion Ion Implantation and Deposition (MPIII&D) using a Newly Developed Plasma Source," Surface and Coatings Technology, vol. 200, Issues 1-4, Oct. 1, 2005, pp. 579-583.

Xu, et al., "Double glow plasma surface metallurgy and its applications," Plasma Surface Engineering Research and its Practical Applications, 2008: 355-379.

Wei, et al., "RF Plasma Enhanced Cylindrical Magnetron Sputter Deposition," 2008 Society of Vacuum Coaters, 51st Annual Technical Conference Proceedings, Chicago, IL, Apr. 19-24, 2008, pp. 559-564.

Chiang, et al. "Oxidation studies of Cu-Cr-coated Cu-Nb microcomposite" (5 pages).

U.S. Appl. No. 11/838,399, filed Aug. 14, 2007, Chiang et al.

Chiang, et al. "Oxidation Kinetics of Cu-30vol.%Cr coating" (5 pages).

Chiang, et al. "Blanching resistant Cu-Cr coating by vacuum plasma spray" (6 pages).

Malik, et al. "Development of an energetic ion assisted mixing and deposition process for TiNx and diamondlike carbon films, using a co-axial geometry in plasma source ion implantation" (5 pages).

Ensinger "An Apparatus for Sputter Coating the Inner Walls of Tubes" (4 pages).

Hosokawa, et al. "Self-sputtering Phenomena in High-rate Coaxial Cylindrical Magnetron Sputtering" (4 pages).

Truszkowska, et al. "Cylindrical Magnetron Sputter Deposition of Chromium Coatings for Erosion and Wear Resistant Application" (7 pages).

Yee, et al. "Cylindrical Magnetron Sputtering in a Ferromagnetic Cylinder" (5 pages).

U.S. Appl. No. 11/397,878, filed Apr. 4, 2006, Chiang et al.

Rusch, "Tri-Service Green Gun Barrel (PP 1074)" Final Report, Mar. 31, 2003 (39 pages).

U.S. Office Action dated Sep. 22, 2010 issued in related U.S. Appl. No. 11/838,399.

U.S. Office Action dated Mar. 14, 2011 issued in related U.S. Appl. No. 11/838,399.

* cited by examiner

APPARATUS AND METHOD FOR RF PLASMA ENHANCED MAGNETRON SPUTTER DEPOSITION

CROSS REFERENCE TO RELATED APPLICATIONS

This application claims the benefit of the filing date of U.S. Provisional Application No. 60/800,886 filed May 16, 2006, whose teachings are incorporated herein by reference.

GOVERNMENT RIGHTS CLAUSE

This invention was made with United States Government support under contract number W15QKN05P0230 awarded by the United States Army. The Government has certain rights in the invention.

FIELD OF THE INVENTION

This disclosure pertains to electrode-type glow discharge devices that may be used in the field of thin film deposition, and more particularly to a method and apparatus for applying coating by magnetron sputtering using a source of RF in which surface cleaning and material deposition may be provided in a continuous process.

BACKGROUND

There are a few reported approaches to deposit an inner diameter (ID) coating on tubular structures including the use of plasma, S. M. Malik, R. P. Fetherston, J. R. Conrad, J. Vac. Sci. Technol., A15, 2875 (1997), ion beam W. Ensinger, Rev. Sci. Instrum., 67 (1), 1996, and magnetron sputtering, N. Hosokawa, et al. J. Vac. Sci. Technol., 14 (1), 1977, and U.S. Pat. No. 6,767,436. Using these methods, coatings have been deposited in bores. Cylindrical magnetron sputtering (CMS) has also been reportedly used for deposition of relatively thick metallic coatings (such as tantalum for gun barrels) or hard ceramic coatings (such as chromium nitrides).

SUMMARY

In a first exemplary embodiment, the present disclosure relates to an apparatus for depositing coatings on the surface of a workpiece with sputtering material in an ion plasma environment. The apparatus may include a magnetron including a core cooling system surrounded at least in part by a magnet assembly including target material having a surface capable of providing a source of sputtering material. The magnetron assembly is capable of providing a negative bias and drawing ions from the plasma to the target material resulting in ion sputtering. An RF plasma generation assembly may be provided including an RF antenna capable of providing an RF plasma and drawing ions to either or both of the workpiece surface or the target material surface.

In another exemplary embodiment the present disclosure again relates to an apparatus for depositing coatings on the surface of a workpiece with sputtering material in an ion plasma environment. The apparatus may include a magnetron including a core cooling system surrounded at least in part by a magnet assembly and target material having a surface capable of providing a source of sputtering material. The magnetron assembly is again capable of providing a negative bias and drawing ions from the plasma to the target material resulting in ion sputtering. An RF plasma generation assembly is again provided including an RF antenna capable of providing an RF plasma and drawing ions to one of said workpiece surface and said target material surface. A vacuum chamber may then be provided including a gas inlet and gas outlet, the vacuum chamber surrounding the apparatus wherein the workpiece may form a portion of the vacuum chamber and wherein gas may be introduced and removed from the vacuum chamber.

In a still further exemplary embodiment the present disclosure relates to a method for depositing coatings on the surface of a workpiece with sputtering material in an ion plasma environment which includes providing a magnetron including a core cooling system surrounded at least in part by a magnet assembly and target material having a surface capable of providing a source of sputtering material wherein the magnetron assembly is capable of providing a negative bias and drawing ions from the plasma to said target material resulting in ion sputtering. One may then provide an RF plasma generation assembly including an RF antenna capable of providing an RF plasma and drawing ions to one of said workpiece surface and said target material surface. This may then be followed by applying power to the RF generation assembly and biasing said workpiece and magnetron assembly and ion-cleaning either or both of the target and the workpiece.

DETAILED DESCRIPTION

In general, this disclosure pertains to the deposition of coatings onto the surface of a workpiece, such as the inner surface of a cylinder. In many situations, the inner diameter (ID) of tubes and pipes may need protection from wear, erosion or corrosion. It therefore may be appreciated that the present disclosure may provide improved coating efficiency which may be achieved by ion cleaning of surface oxides before ion bombardment and film deposition.

Relatively insufficient cleaning may leave surface oxides before the film is deposited. The oxides at the interface may therefore be detrimental to the ensuing film adhesion. On the other hand, insufficient ion bombardment during film deposition may lead to the formation of a columnar structure of the coating film with voids. Such a coating may then fail in corrosive environments, such as the explosives in gun firing. Corrosive mediums may then penetrate through the coating to attack the substrate directly.

The method and apparatus disclosed herein employs RF plasma, which may be used in conjunction to the magnetron-generated plasma, which RF plasma may be generated via an RF (radio frequency) antenna placed into, e.g. a cylindrical magnetron sputtering (CMS) apparatus. This RF-generated plasma may therefore also be understood as an RF plasma enhanced CMS apparatus which may increase the ion density in the coatings that are formed. In addition, the surface for film formation may be electrically biased such that ions may be drawn to both clean the surface oxides and bombard the film coating during its growth. As a result, the film may have a higher relative density with relatively stronger adhesion to a given workpiece surface.

Accordingly, in one exemplary form, this disclosure relates to an apparatus for treating a tubular part, including a magnetron sputtering device and an RF source that at least partially surrounds the magnetron sputtering device. The magnetron sputtering device which may be cylindrical (which may also be understood as a coaxial magnetron for sputter-coating) may therefore include one or a plurality of magnets, a magnet power supply and an RF antenna that may be in the form of a wire spiral or mesh that may wrap around all or a portion of the magnets. An RF power supply may also be included. A target material may then be included, which also may be tubular and which may wrap around all or a portion of the magnets. The target material may then supply the ions for deposition. This apparatus can be placed in a vacuum chamber. Likewise, the part to be treated may be placed in the vacuum chamber, with the magnetron apparatus placed within the bore of the part to be treated.

Figure 1:
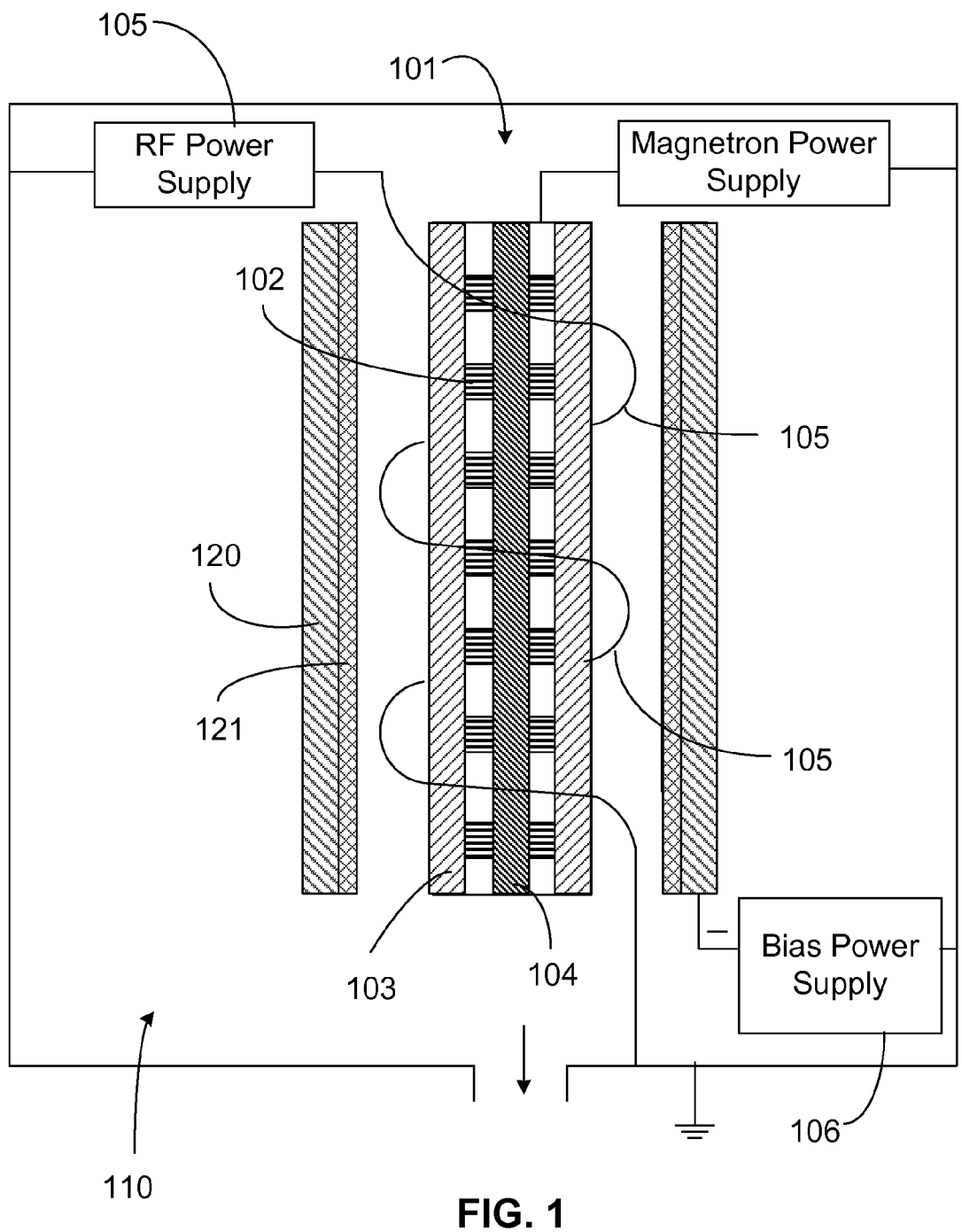
FIG. 1 illustrates in cross-sectional view one exemplary magnetron device of the present disclosure employing ring magnets.

Attention is directed to FIG. 1 which illustrates an exemplary magnetron device of the present disclosure. As illustrated therein, the device may contain magnets 102, a target 103 that may supply the metal ions to be impregnated into a part, an optional rod 304 for holding the magnets, an optional cooling channels/system (not shown, such as illustrated in U.S. Pat. No. 6,767,436, incorporated in its entirety herein by reference), a bias power supply 106, and a source of RF 105. In FIG. 1, a part (tube) 120 to be treated is also depicted, on which a coating 121 has been deposited. The device 101 may also include translation mechanisms for the ring magnets 102 shown in FIG. 1 or the rectangular block magnets 202 shown in FIG. 2 to provide for relatively more uniform deposition. The RF source can be formed, for example, from a wire 105 such as shown in FIG. 1 or using mesh 305 such as shown in FIG. 3. The amount of wire 105 used to form the RF source may be adjusted so that relatively minimal sealing of ions occurs and so that relatively minimal coating of the wire occurs. In one exemplary embodiment, three to five turns of wire may used to form the RF supply 105. An RF power supply, not shown, may supply power to the RF source, which power may be up to about 200 W and wherein the wire may be formed form a metallic material such as tungsten. It should be appreciated that tunable RF power supplies may also be used. Likewise, a magnetron power supply, not shown, may supply power to the CMS apparatus.

The device 101 may be provided within a vacuum chamber 110. The vacuum chamber may be assembled from a variety of materials and may be in a variety of three dimensional shapes and sizes. For example, the chamber may be made of metals and alloys that conduct electricity, including but not limited to steel, aluminum, iron, stainless steel, copper, and so on. The vacuum chamber may have a variety of shapes including shapes such as an elongated cylinder, and having a square, rectangular, triangular, and square base, etc. Since the vacuum chamber is under a vacuum, the type of material and its thickness may be such that it may be effective to enable the vacuum chamber to retain its shape while under vacuum. The vacuum chamber may also be made of one or more materials and may have one or more layers. The chamber may optionally be thermally insulated. The vacuum chamber may include one or more doors to open or seal the vacuum chamber.

The vacuum chamber 110 also may include a vacuum line, not shown, that extends to a vacuum source, not shown, such as a vacuum pump. One or more vacuum lines can be used. Similarly, more than one vacuum pump may be employed to reduce the pressure in the vacuum chamber. The source of vacuum is capable of providing a vacuum in the chamber prior to processing of below about $10^{-5}$ Torr. In one embodiment, the (base) pressure may be reduced to about $2 \times 10^{-6}$ Torr.

The vacuum chamber 110 may include a worktable or part support, not shown, on which the workpiece 120 to be treated may be placed. All or a portion of the worktable can be made of insulating materials such as ceramics. The worktable can have one or more surfaces, such as having more than one shelf or stage on which to place workpiece 120 to be treated. A portion of the worktable can be made from a variety of electrically conductive materials, such as those used to make the vacuum chamber 110. The worktable can be made in a variety of shapes and sizes. The worktable may hold one or a plurality of workpieces 120 to be treated.

Figure 2:
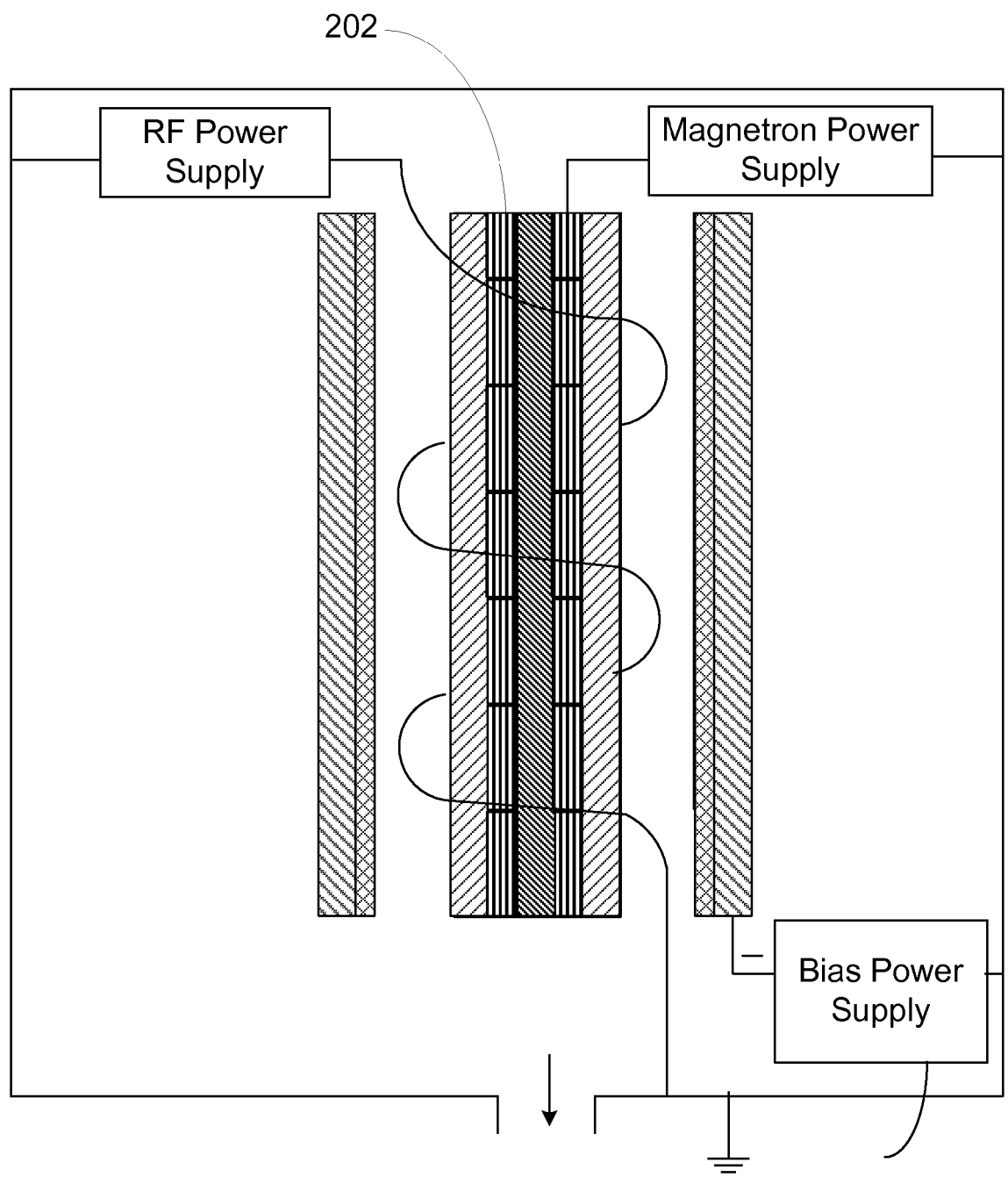
FIG. 2 illustrates in cross-section view another exemplary magnetron device of the present disclosure employing rectangular magnets.
Figure 3:
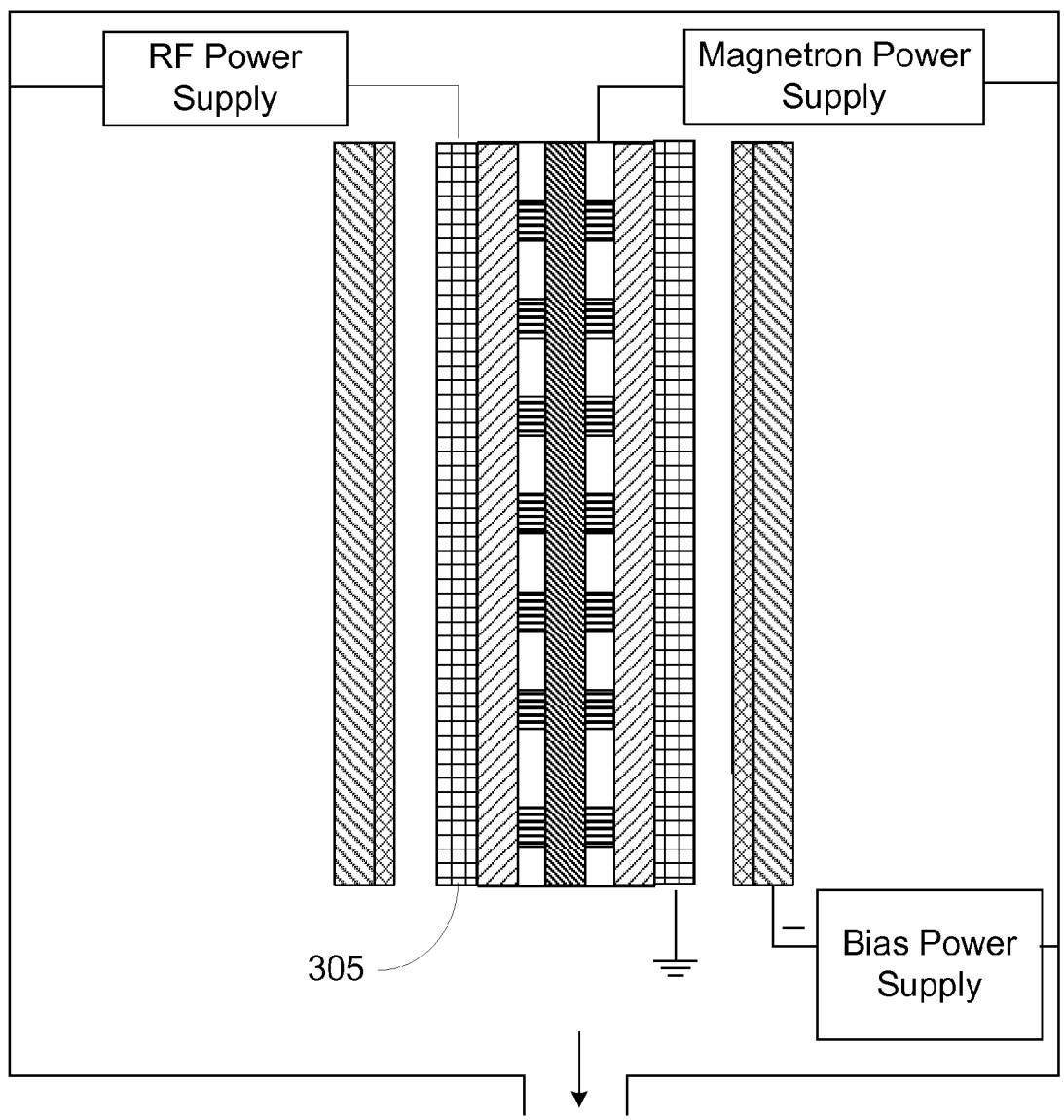
FIG. 3 illustrates in cross-sectional view another exemplary magnetron device of the present disclosure wherein the RF source is in mesh form.
Figure 4:
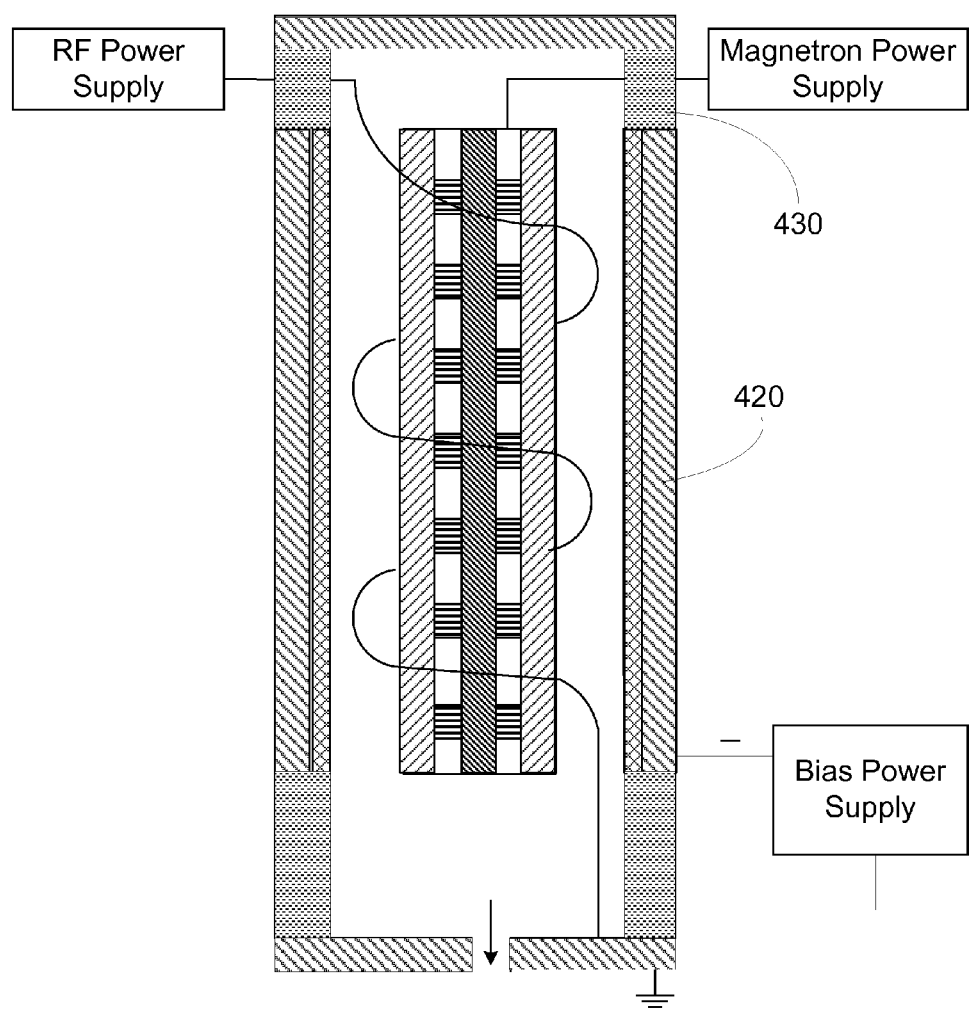
FIG. 4 illustrates in cross-sectional view another exemplary magnetron device of the present disclosure wherein the part to be cleaned and/or treated may function as a portion of the structure forming the vacuum chamber.

FIGS. 2-4 show additional, representative embodiments of this disclosure. The devices shown in FIGS. 2-4 are similar to that shown in FIG. 1 except that in FIG. 2 rectangular magnets 202 are used, in FIG. 3 mesh 305 is the material used to form the RF source, and in FIG. 4 the part 420 to be cleaned and/or treated functions as defining a portion of the vacuum chamber in which ceramic standoffs 430 may be employed to isolate and seal the vacuum apparatus. The tubular parts 120 to be treated can be formed from a variety of materials or combination of materials and as can be seen in all of the drawings the parts may be positioned such that the magnetron 101 is positioned within the inner diameter of the part to be coated. For example, the parts can be made of metallic or non-metallic materials. The parts may also be specifically made of silicon, molybdenum, nickel, ceramic, iron, various steels, titanium, titanium alloy, and so on. Likewise, the shape and size of the parts may vary. The part may also have a bore that is rectangular or some other inside diameter configuration.

As discussed above, there may be two considerations to monitor when attempting to provide a given coating: sufficient ion sputter cleaning of the workpiece (tube) surface before film deposition and sufficient ion bombardment of the film during its growth. In some CMS systems, to achieve both requirements, several steps may be necessary, and sometimes after cleaning, the vacuum system has to be vented for installing the CMS apparatus. For example, the tube surface may be cleaned using a glow discharge plasma without the presence of the CMS. Then the vacuum may be vented, and the CMS apparatus is installed and pumped down for deposition. This process may cause problems such as re-oxidation of the workpiece (tube) surface.

The method and apparatus of the present may therefore provide a coating on a relatively clean surface without the need to break the vacuum system. In addition, the method and apparatus of this invention may clean the entire surfaces of both the tube and the target simultaneously before film deposition. Referring to FIG. 1, when the magnetron 101 is installed in a vacuum chamber 110, and after the chamber is evacuated, a gas such as Ar (Kr, or Xe) may be introduced into the chamber to a given pressure such as about 3 millitorr. Then the RF power supply may be turned on, which may be up to about 200 watts. After tuning the matching network, an RF plasma may be generated which may be maintained for a period of up to about 180 minutes, in the presence of a gas such as argon. The tube/part 120 may be biased with a negative voltage such as up to about 150V, including all values and increments therein, e.g. 10-150V. Ions in the plasma may then be drawn to the tube/part 120 causing ion (sputter) cleaning of its surface. This ion energy may be high enough to remove substantially all surface oxides (e.g., 75-100% of the surface oxides) to accomplish a relatively thorough cleaning. Surface oxides may be understood as compounds containing oxygen, for example a metal oxide. At the same time, the magnetron 101 may be operated in a voltage-control mode and provide a voltage of between 30-120V (including all values and increment therein) such that the target may also be ion cleaned. It is worth nothing that excess voltage (above about 200 volts) on either the tube or the target may cause ion sputtering of their respective surfaces and the sputtered material may then be deposited on the opposite surface, which may then cover an oxide which may then avoid ion cleaning.

After ion cleaning, the magnetron 101 may be switched to a power-control mode. This may then allow ion sputtering of the target material, typically a metal, at a relatively high rate. Suitable gases for such magnetron ion sputtering may include nitrogen or a carbonaceous gas such as methylene or acetylene, which gases may be present up to about 20% of the total gas pressure. The sputtered metal atoms or clusters may then be deposited on the ID of the tube 120. The tube bias voltage may also be reduced to a relatively lower voltage of 40V, for example, so that ion bombardment of the film is more readily accomplished. This ion bombardment may then ensure relatively strong adhesion and relatively high density of the film coating. It should be appreciated that the transition from ion sputter cleaning to the deposition of the film may be accomplished by switching the magnetron operation mode and the bias voltage on the tube without any interruption of the RF plasma. Likewise, there may be no need to break the vacuum, thereby eliminating the possibility of re-oxidation at the film/substrate interface.

The target used to form the ions can be made of a variety of metal or metallic materials such as but not limited to chromium (Cr), titanium (Ti), molybdenum (Mo), zinc (Zn), nickel (Ni), cadmium (Cd), gold (Au), silver (Ag), cobalt (Co), tin (Sn), copper (Cu), yttrium, combinations of metals, or non-metallic material such as B and Si. Accordingly, any metal is contemplated for use herein which is capable of forming ions in the practice of this disclosure.

of the sample that was covered during the ion cleaning showed the gold-brown color of the oxide, while the ion cleaned area showed the silver-metallic color.

Figure 5:
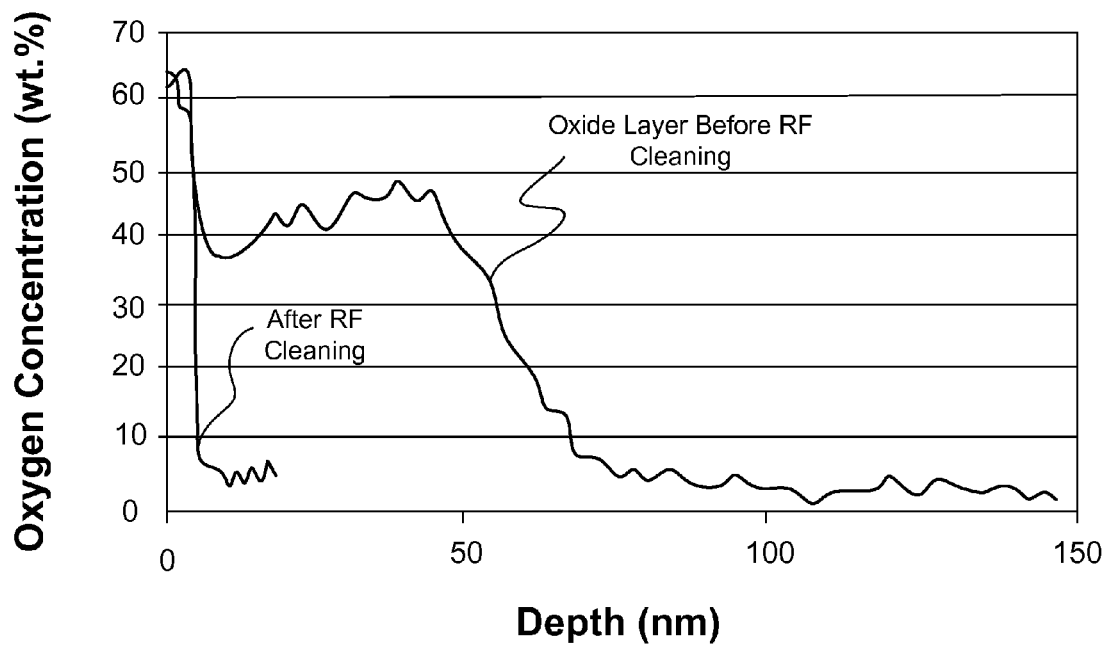
FIG. 5 provides a comparison of the Auger electron spectroscopy data from oxidized samples and RF ion cleaned samples.

Shown in FIG. 5 is the comparison of the Auger electron spectroscopy (AES) data obtained from the oxidized area and the RF plasma ion cleaned area of the sample. It is noted that the heat-generated oxide layer was about 70 nm thick. In the ion cleaned area, the oxide layer from the Auger data is 6 nanometers and it is due to the exposure of the sample to air after it was removed from the system and before being transferred to the AES system. As can be seen upon comparison of the two curves, the RF plasma treatment as disclosed herein is effective at reducing the surface oxide layers of samples prior to magnetron sputtering and film formation.

To further demonstrate certain other advantages of the present invention, several deposition tests were conducted by placing steel samples on the ID of the tube. In this experiment a mesh antenna was used according to the exemplary device shown in FIG. 3. Three tests were conducted. In the first test, no RF was applied to the antenna and the tube was not biased. This was intended to simulate conventional CMS deposition. In the second case, RF power was employed and the tube was biased 40V. This was to simulate the conventional magnetron deposition but with the tube being biased to draw ions from the magnetron plasma. In the third test, 200 W power was applied to the RF antenna and the tube was biased at −40V. In all these three tests, the step of ion cleaning was identical and a steel sample without thermally formed oxides was used to emphasize either the effect of the RF plasma enhanced deposition. After the deposition, a scratch test was conducted (ASTM C1624) to determine the critical load to cause delamination of the coating. The processing parameters and the data obtained are shown in Table 1.

From Table 1, it is to be noted that for Test 1, no ion current was drawn to the tube. For Test 2, there was a relatively small current of about 0.05 A to the tube. In contrast, for Test 3, the ion current was increased to 0.35 A, about a 6× increase. The critical load increased from 5N to 11-12N with the bias and RF enhanced plasma. Therefore, it may be observed that the apparatus and process of this disclosure may outperform magnetron sputter deposition in which no RF plasma is employed and provide, e.g., a coating with a critical load of greater than 5N.

TABLE 1

Comparison of Conventional Cylindrical Magnetron Sputtering And RF-Plasma Enhanced Magnetron Sputtering

| | | Ion Cleaning | | | | | Film Deposition | | | | | | | |
|---|---|---|---|---|---|---|---|---|---|---|---|---|---|---|
| Sample No | RF Power (W) | Gas 1 | Flow Rate (sccm) | Gas 2 | Flow Rate (sccm) | Time (min) | Gas 1 | Flow Rate (sccm) | Time (min) | RF (W) | Vb (V) | Ib (A) | Target Material | Mg (KW) | Critic load (N) |
| Test 1 | 200 | Ar | 240 | H2 | 60 | 300 | Ar | 240 | 210 | 0 | 0 | 0 | Ta | 1 | 5 |
| Test 2 | 200 | Ar | 240 | H2 | 60 | 300 | Ar | 240 | 210 | 0 | 40 | 0.05 | Ta | 1 | 12 |
| Test 3 | 200 | Ar | 240 | H2 | 60 | 300 | Ar | 240 | 210 | 200 | 40 | 0.32 | Ta | 1 | 11 |

The following examples are representative and not intended to limit the scope of this disclosure or claims hereto. In particular, to demonstrate the above described cleaning effect, a steel sample was attached at about the center of inner surface of the tube 120 shown in FIG. 2. The sample was previously oxidized in oxygen at 350° C. for one hour to purposely grow a relatively thick surface oxide. Then the sample was ion cleaned for about 2 hrs using Ar with the RF power of 200 W on the tungsten wire antenna. A small portion In Table 1, it should be noted that Vb is reference to voltage of the workpiece (tube), sccm is reference to standard cubic centimeters/minute, Ib is reference to the current of the workpiece (tube), and Mg is reference to the magnetron and KW refers to kilowatts. As noted above, the Critical Load is reference to the load necessary for delamination according to ASTM C1624.

Although illustrative embodiments and methods have been shown and described, a wide range of modifications, changes, and substitutions is contemplated in the foregoing disclosure and in some instances some features of the embodiments or steps of the method may be employed without a corresponding use of other features or steps. Accordingly, it is appropriate that the claims be construed broadly and in a manner consistent with the scope of the embodiments disclosed herein.

What is claimed is:

1. A method for depositing coatings on the interior surface of a workpiece with sputtering material in an ion plasma environment comprising:
   providing a magnetron within said workpiece, wherein said magnetron has a length and includes a core cooling system surrounded by a magnet assembly and a target material, said target material having a surface capable of providing a source of sputtering material wherein said magnetron assembly is capable of providing a negative bias and drawing ions from the plasma to said target material resulting in ion sputtering;
   providing an RF plasma generation assembly including an RF antenna coil capable of providing an RF plasma and drawing ions to one of said workpiece surface and said target material surface, wherein at least a portion of the RF antenna coil is wrapped around said magnetron along the length of said magnetron and positioned between said magnetron and said workpiece within a region bound by said magnetron and workpiece; and
   applying power to the RF generation assembly generating RF plasma and biasing said workpiece and magnetron assembly and ion-cleaning one of said target material and said workpiece with said RF plasma wherein said workpiece is biased up to 150 volts and said magnetron assembly is biased at 30-120 volts during said ion-cleaning.

2. The method of claim 1 wherein cleaning of said one of said target and said workpiece is conducted for a period up to about 180 minutes.

3. The method of claim 1 wherein, subsequent to said cleaning, magnetron sputter deposition is applied, wherein said magnetron is biased up to about 4 kilowatts.

4. The method of claim 3 wherein said workpiece is biased at less than about 50 volts.

5. The method of claim 1 wherein said workpiece includes surface oxides and wherein said cleaning removes about 75% or more of said surface oxides.

6. The method of claim 3, wherein said magnetron sputter deposition provides a coating on said workpiece wherein said coating indicates a load for delamination of greater than 5N according to ASTM C1624.

* * * * *